US012624474B2

(12) United States Patent
Shiomi

(10) Patent No.: US 12,624,474 B2
(45) Date of Patent: May 12, 2026

(54) SiC SINGLE-CRYSTAL GROWTH APPARATUS AND METHOD OF GROWING SiC CRYSTAL

(71) Applicant: SEC CARBON, Ltd., Amagasaki (JP)

(72) Inventor: Hiromu Shiomi, Amagasaki (JP)

(73) Assignee: SEC CARBON, LTD., Amagasaki (JP)

( * ) Notice: Subject to any disclaimer, the term of this patent is extended or adjusted under 35 U.S.C. 154(b) by 421 days.

(21) Appl. No.: 18/263,817

(22) PCT Filed: Jan. 18, 2022

(86) PCT No.: PCT/JP2022/001564
§ 371 (c)(1),
(2) Date: Aug. 1, 2023

(87) PCT Pub. No.: WO2022/209162
PCT Pub. Date: Oct. 6, 2022

(65) Prior Publication Data
US 2024/0068125 A1 Feb. 29, 2024

(30) Foreign Application Priority Data

Mar. 31, 2021 (JP) ................................. 2021-062112

(51) Int. Cl.
*C30B 23/06* (2006.01)
*C30B 29/36* (2006.01)
(52) U.S. Cl.
CPC ............ *C30B 23/066* (2013.01); *C30B 29/36* (2013.01)
(58) Field of Classification Search
CPC ...... C30B 29/36; C30B 23/063; C30B 23/066
See application file for complete search history.

(56) References Cited

U.S. PATENT DOCUMENTS 5,667,587 A * 9/1997 Glass .................. C23C 14/0635
117/200
2017/0137964 A1 5/2017 Loboda

FOREIGN PATENT DOCUMENTS

JP 2005225710 A 8/2005
JP 5146418 B2 2/2013
(Continued)

*Primary Examiner* — Joseph A Miller, Jr.
(74) *Attorney, Agent, or Firm* — Rabin & Berdo, P.C.

(57) ABSTRACT

An SiC single-crystal growth apparatus and a method of growing an SiC crystal are provided capable of reducing variations in the temperature distribution in the seed crystal and/or reducing deformation of, and/or damage to, the seed crystal, thereby growing an SiC single crystal with reduced defects and/or cracks. An SiC single-crystal growth apparatus (1) includes: a heating vessel (10) including a source material-containing portion (12) adapted to contain a solid source material of SiC in one of an upper portion or a lower portion (e.g., on the bottom portion 13) of an interior space S defined by a cylindrical peripheral side portion (14), and including a seat (17) located in another portion located opposite to said one portion (e.g., lid (16)) for allowing a seed crystal (2) of SiC to be mounted thereon; and a heating member (3) adapted to heat the solid source material M(s), where: the seed crystal (12) is mounted on the seat (17) with a first anisotropic sheet (41) positioned therebetween, the first anisotropic sheet having anisotropy in thermal conductivity; and, in the first anisotropic sheet (41), the thermal conductivity in a direction in the plane of the sheet, x, is high and the thermal conductivity in the thickness direction of the sheet, y, is low.

7 Claims, 7 Drawing Sheets

(56)     References Cited

FOREIGN PATENT DOCUMENTS

| JP | 2015-074602 A | 4/2015 |
| JP | 2016-124777 A | 7/2016 |
| JP | 6444890 B2 | 12/2018 |
| RU | 2633909 C1 | 10/2017 |

* cited by examiner (a)

(b)

(a)

(b)

SiC SINGLE-CRYSTAL GROWTH APPARATUS AND METHOD OF GROWING SiC CRYSTAL

TECHNICAL FIELD

The present invention relates to an SiC single-crystal growth apparatus and a method of growing an SiC crystal.

BACKGROUND ART

Silicon carbide (SiC) provides excellent electric properties, namely, a dielectric breakdown field that is approximately one order of magnitude higher, and a bandgap that is approximately three times larger, than that of silicon (Si). Further, SiC provides an excellent thermal property, namely, a thermal conductivity that is approximately three times as high as that of Si. Due to these excellent properties, SiC is expected to be used in various devices, such as power devices, high-frequency devices, and high-temperature operating devices.

These devices are fabricated by machining an SiC single-crystal ingot to produce an SiC single-crystal substrate and using chemical vapor deposition (CVD) and/or other methods to form an epitaxial layer that is to provide an active region of the resulting device. One known method of forming an SiC single-crystal ingot is the sublimation method.

The sublimation method involves: positioning a seed crystal, composed of an SiC single crystal, inside a crucible made of graphite; heating the crucible and source material powder (i.e., source material in the crucible) to cause the source material powder (i.e., source material) in the crucible to sublimate into sublimated gas; supplying this gas to the seed crystal, thereby growing the seed crystal into a larger SiC single-crystal ingot.

An SiC single crystal-manufacturing crucible used to form an SiC single crystal with the sublimation method is described in Patent Document 1, which discloses a crucible with a seed crystal mounted thereon, where the seed crystal is adsorbed onto the lid of the crucible. More specifically, Patent Document 1 discloses a crucible including a lid having through-holes, extending therethrough between the inside and the outside of the crucible, that are closed by a seed crystal adsorbed thereon during the growth of a crystal, and a seed-crystal support means located below the seed-crystal contact surface of the lid for supporting the seed crystal while retaining a clearance from the seed-crystal contact surface so that the seed crystal can be adsorbed onto the crucible lid by controlling the difference between the pressures inside and outside the crucible.

Another method of manufacturing an SiC single crystal with the sublimation method is described in Patent Document 2, which discloses reducing crystal defects in an SiC single crystal by preventing the seed crystal from being subjected to stress. More specifically, Patent Document 2 discloses promoting vapor transport of gaseous source material toward the seed crystal while directing gas flow from below the seed crystal past the periphery of the seed crystal to the center of the volume between the ceiling of the heating vessel and the backside of the seed crystal to prevent the backside of the seed crystal to contact the ceiling of the heating vessel.

PRIOR ART DOCUMENTS

Patent Documents

Patent Document 1: Japanese Patent No. 5146418
Patent Document 2: Japanese Patent No. 6444890

SUMMARY OF THE INVENTION

Problems to be Solved by the Invention

During the growth of an SiC single crystal, portions of the seed crystal that are in contact with the seat located adjacent thereto experience thermal stress and/or distortion due to the differences in thermal expansion between the seed crystal and the seat, which may result in defects and/or cracks in the grown SiC single crystal. Further, variations in temperature in the seat adjacent to the seed crystal may cause variations in the temperature distribution in the seed crystal and thus produce thermal stress in the seed crystal, which may also result in defects in the grown SiC single crystal. To address this, the crucible of Patent Document 1 reduces thermal stress and/or distortion due to the differences in thermal expansion between the crucible lid and seed crystal by causing the seed crystal to be adsorbed onto the crucible lid to mount it on the crucible; however, the document fails to address, at least, variations in the temperature distribution in the seed crystal.

The method of Patent Document 2 reduces crystal defects in an SiC single crystal by directing gas flow into the volume between the ceiling of the heating vessel and the backside of the seed crystal to keep the backside of the seed crystal floating from the ceiling of the heating vessel. However, since the seed crystal is not attached to the seat or the like in the method of Patent Document 2, thermal conductivity is not uniform across the plane of the seed crystal (i.e., varies going from the middle to the periphery), making it difficult to achieve a uniform crystal growth rate across the plane, i.e., similar rates at the middle and at the periphery. Further, in the method of Patent Document 2, the seed crystal is clamped by spacers to hold it; as such, the clamping force of the spacers may damage the seed crystal. Furthermore, central portions of the seed crystal may be warped downward by gravity, causing defects and/or cracks in the resulting SiC single crystal.

An object of the present invention is to provide an SiC single-crystal growth apparatus and a method of growing an SiC crystal capable of reducing variations in the temperature distribution in the seed crystal and/or reducing deformation of, and/or damage to, the seed crystal, thereby growing an SiC single crystal with reduced defects and/or cracks.

Means for Solving the Problems

The present inventors discovered that, if a seed crystal of SiC is attached to a seat with a first anisotropic sheet positioned therebetween, the first anisotropic sheet having such an anisotropy in thermal conductivity that the thermal conductivity in a direction in its plane is high and the thermal conductivity in its thickness direction is low, then, heat generated by the growth of the SiC single crystal is released from the seed crystal to the seat through the first anisotropic sheet and, at the same time, variations in the temperature distribution in the sheet plane of the first anisotropic sheet are reduced, thereby reducing variations in the temperature distribution inside the seed crystal, and arrived at the present invention.

Specifically, the construction of the present invention is outlined as follows:

(1) An SiC single-crystal growth apparatus including: a heating vessel including a source material-containing portion adapted to contain a solid source material of SiC in one of an upper portion or a lower portion of an interior space defined by a cylindrical peripheral side portion, and including a seat located in another portion located opposite to said one portion for allowing a seed crystal of SiC to be mounted thereon; and a heating member adapted to heat the solid source material, where: the seed crystal is mounted on the seat with a first anisotropic sheet positioned therebetween, the first anisotropic sheet having anisotropy in thermal conductivity; and, in the first anisotropic sheet, a thermal conductivity in a direction in a plane of the sheet is high and a thermal conductivity in a thickness direction of the sheet is low.

(2) The SiC single-crystal growth apparatus starting from apparatus (1) above, where the first anisotropic sheet is formed to have a larger surface area than each of the seed crystal and the seat so as to expand from between the seed crystal and the seat.

(3) The SiC single-crystal growth apparatus starting from apparatus (1) or (2) above, where a seed crystal-mounting surface of the first anisotropic sheet has an arithmetical mean roughness (Ra) not higher than 1 μm.

(4) The SiC single-crystal growth apparatus starting from any one of apparatus (1) to (3) above, where the first anisotropic sheet has a thickness in a range of not smaller than 0.04 mm and not larger than 2 mm.

(5) The SiC single-crystal growth apparatus starting from any one of apparatus (1) to (4) above, further including: a guide member located in the interior space and between the seed crystal and the source material-containing portion and at a peripheral side portion of the heating vessel for guiding a direction of growth of the SiC single crystal growing from a surface of the seed crystal, the guide member being located adjacent to a peripheral side surface of the SiC single crystal, where: a surface of the guide member facing the growing SiC single crystal is covered with a second anisotropic sheet having anisotropy in thermal conductivity; and, in the second anisotropic sheet, a thermal conductivity in a direction in a plane of the sheet is high and a thermal conductivity in a thickness direction of the sheet is low.

(6) The SiC single-crystal growth apparatus starting from apparatus (5) above, where the surface of the second anisotropic sheet facing the single crystal has an arithmetical mean roughness (Ra) not higher than 1 μm.

(7) The SiC single-crystal growth apparatus starting from apparatus (5) or (6) above, where the second anisotropic sheet has a thickness in a range of not smaller than 0.04 mm and not larger than 2 mm.

(8) A method of growing an SiC crystal including growing an SiC single crystal using the SiC single-crystal growth apparatus starting from any one of apparatus (1) to (7) above.

Effects of the Invention

The present invention provides an SiC single-crystal growth apparatus and a method of growing an SiC crystal capable of reducing variations in the temperature distribution in the seed crystal and/or reducing deformation of, and/or damage to, the seed crystal, thereby growing an SiC single crystal with reduced defects and/or cracks.

EMBODIMENTS FOR CARRYING OUT THE INVENTION

Now, SiC single-crystal growth apparatus of some embodiments of the present invention will be described.

First Embodiment

Figure 1:
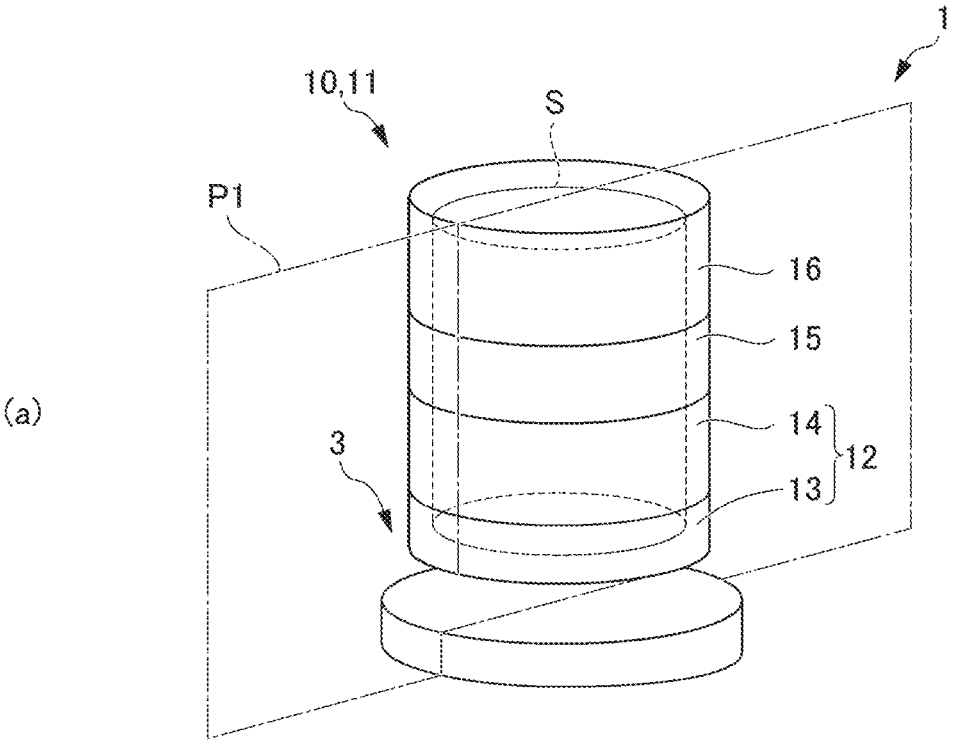
FIG. 1 shows an SiC single-crystal growth apparatus of a first embodiment of the present invention, schematically illustrating the structure of its main components, FIG. 1(*a*) being a perspective view, FIG. 1(*b*) being a cross-sectional view of the apparatus taken on imaginary plane P1 of FIG. 1(*a*), showing the crucible and heating member as being separated.
Figure 1:
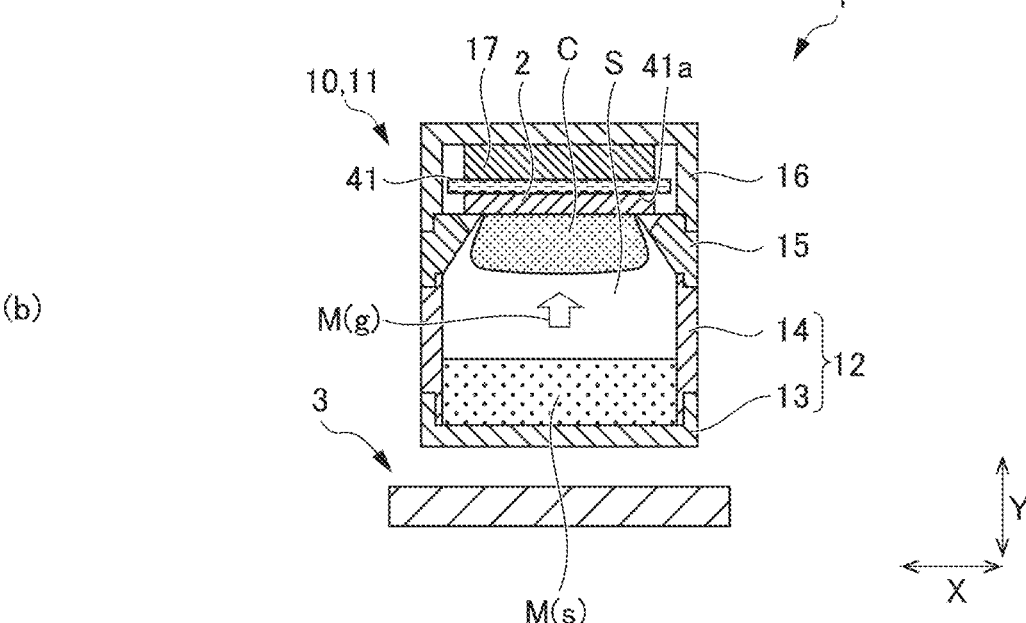
Figure 2:
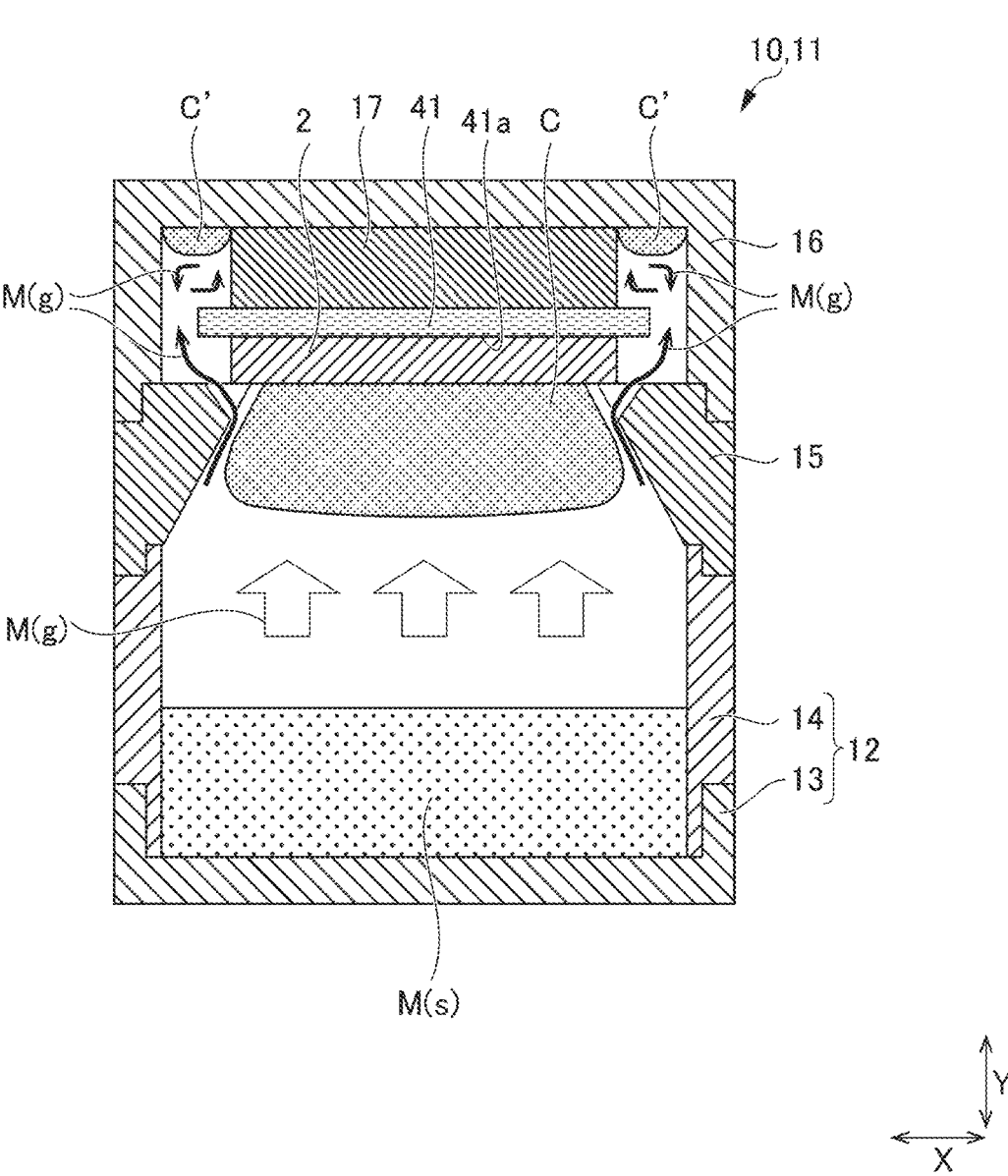
FIG. 2 schematically illustrates how gaseous source material flows when an SiC single crystal is grown in the SiC single-crystal growth apparatus of the first embodiment.

FIG. 1 shows an SiC single-crystal growth apparatus of a first embodiment of the present invention, schematically illustrating the structure of its main components, FIG. 1(*a*) being a perspective view of the apparatus showing a crucible as being transparent so its interior space S is visible, FIG. 1(*b*) being a cross-sectional view of the apparatus taken on imaginary plane P1 of FIG. 1(*a*). FIG. 2 schematically illustrates how gaseous source material flows when an SiC single crystal is grown in the SiC single-crystal growth apparatus of the first embodiment.

As shown in FIG. 1, the SiC single-crystal growth apparatus 1 of the first embodiment of the present invention includes: a heating vessel 10 including a source material-containing portion 12 adapted to contain a solid source material of SiC in one of an upper portion or a lower portion (e.g., on the bottom 13) of the interior space S defined by a cylindrical peripheral side portion 14, and including a seat 17 located in the other portion (e.g., adjacent to the lid 16) located opposite to said one portion for allowing a seed crystal 2 of SiC to be mounted thereon; and a heating member 3 adapted to heat the solid source material M(s), where: the seed crystal 2 is mounted on the seat 17 with a first anisotropic sheet 41 positioned therebetween, the first anisotropic sheet having anisotropy in thermal conductivity; and, in the first anisotropic sheet 41, the thermal conductivity in a direction in the plane of the sheet, x, is high and the thermal conductivity in the thickness direction of the sheet, y, is low.

As the seed crystal 2 of SiC is mounted on the seat 17 with a first anisotropic sheet 41 positioned therebetween, the first anisotropic sheet having such an anisotropy in thermal conductivity that the thermal conductivity in a direction in its plane, x is high and the thermal conductivity in the thickness direction y is low, heat conduction in the thickness direction y of the first anisotropic sheet 41 is slowed and, at the same time, heat conduction in the in-plane direction x is promoted. Thus, variations in the temperature distribution in the surface of the seat 17 are reduced by the first anisotropic sheet 41. In addition, as the seed crystal 2 is in contact with a sheet surface of the first anisotropic sheet 41, heat generated by the growth of the SiC single crystal C can be released from the seed crystal 2 to the seat 17 through the first anisotropic sheet 41 and, at the same time, since the seed crystal 2 is stably supported, deformation of and damage to the seed crystal 2 are less likely to occur. As a result, while the growth of an SiC single crystal C remains efficient, variations in the temperature distribution in the seed crystal 2 and associated thermal stress in, and distortion of, the seed crystal are less likely to occur, and the seed crystal 2 is also less likely to be deformed or damaged, thereby growing an SiC single crystal C with reduced defects and cracks.

The SiC single-crystal growth apparatus 1 of the present embodiment includes at least the heating vessel 10 and the heating member 3.

(Heating Vessel)

The heating vessel 10 is composed of a single crucible, or a plurality of crucibles, 11. Although the SiC single-crystal growth apparatus 1 of FIG. 1 has a heating vessel 10 constituted by a single crucible 11, the heating vessel 10 may be constituted by a plurality of crucibles 11 arranged along the heating member 3 discussed further below (not shown).

The crucible, or each of the crucibles, 11 constituting the heating vessel 10 and having a cylindrical peripheral side portion 14, includes a source material-containing portion 12 adapted to contain solid source material M(s) of SiC in a portion of the interior space S defined by the peripheral side portion 14. The source material-containing portion 12 is defined by, for example, a bottom portion 13 and the cylindrical peripheral side portion 14 coupled to the bottom portion 13. The crucible 11 further includes a seat 17 in addition to the source material-containing portion 12, and preferably further includes a guide member 15 and a lid 16.

The solid source material M(s) is preferably contained in the source material-containing portion 12 in one of an upper portion or a lower portion of the interior space S defined by the peripheral side portion 14 of the crucible 11. For example, in the SiC single-crystal growth apparatus 12 of FIG. 1, the solid source material M(s) is contained in the source material-containing portion 12 in a lower portion of the interior space S of the crucible 11, i.e., on the bottom portion 13. Alternatively, the solid source material M(s) may be contained, for example, in an upper portion of the interior space S of the crucible 11, i.e., in a source material-containing portion provided near the lid 16, the solid source material being placed in a dish or a container (not shown).

The heating vessel 10 includes a seat 17 that allows the SiC seed crystal 2 to be position thereon, located in that one of the upper and lower portions of the interior space S defined by the peripheral side portion 14 of the crucible 11 which does not contain the solid source material M(s). For example, in the SiC single-crystal growth apparatus 1 of FIG. 1, the seat 17 is located in the upper portion of the interior space S of the crucible 11, i.e., on the lid 16. Thus, the solid source material M(s) and seed crystal 2 are located in the same space, i.e., interior space S, such that, when the solid source material M(s) is heated by the heating member 3 discussed further below, the solid source material M(s) contained in the source material-containing portion 12 sublimates into gaseous source material M(g) that can reach the seed crystal 2, thereby growing the SiC single crystal C.

The SiC seed crystal 2 is mounted on the seat 17 of the heating vessel 10 with a first anisotropic sheet 41 positioned therebetween, the sheet having anisotropy in thermal conductivity. As used herein, "thermal conductivity" may refer to the thermal conductivity at a temperature that approximates a temperature condition during the crystal growth, and may be, by way of example, the thermal conductivity at 2200° C.

The first anisotropic sheet 41 is formed such that the thermal conductivity in a direction in the plane, x, is high and the thermal conductivity in the thickness direction y is low. That is, the thermal conductivity in the in-plane direction x is higher than the thermal conductivity in the thickness direction y. This slows heat conduction in the thickness direction y of the first anisotropic sheet 41 and, at the same time, promotes heat conduction in the in-plane direction x. As a result, variations in the temperature distribution in the sheet plane of the first anisotropic sheet 41 are reduced, thereby reducing variations in the temperature distribution in the seed crystal 2, located adjacent thereto.

The anisotropic material used to form the first anisotropic sheet 41 is preferably a carbon material containing carbon fiber, or a graphite sheet. The carbon material containing carbon fiber may be a C/C composite (carbon fiber-reinforced carbon composite). The graphite sheet may be a thin sheet having an arrangement of carbon atoms in a plane similar to graphite, the arrangement plane being aligned with the plane of the surface. Use of such an anisotropic material provides anisotropy to the thermal conductivity of the first anisotropic sheet 41 and, at the same time, improves mechanical strengths of the first anisotropic sheet 41, such as tensile strength and/or bending strength. Such an anisotropic material may be formed by, for example, positioning a thin piece of carbon felt or graphite sheet along a plane that is to provide an in-plane direction x.

In the anisotropic material constituting the first anisotropic sheet 41, the ratio of the thermal conductivity in an in-plane direction x to the thermal conductivity in the thickness direction y is preferably not lower than 2, and more preferably not lower than 10. On the other hand, although not limiting, an upper limit for the ratio of the thermal conductivity in an in-plane direction x to the thermal conductivity in the thickness direction y may be 1000 to allow heat generated by the growth of the SiC single crystal C to be released from the seed crystal 2 to the seat 17 through the first anisotropic sheet 41.

Figure 7:
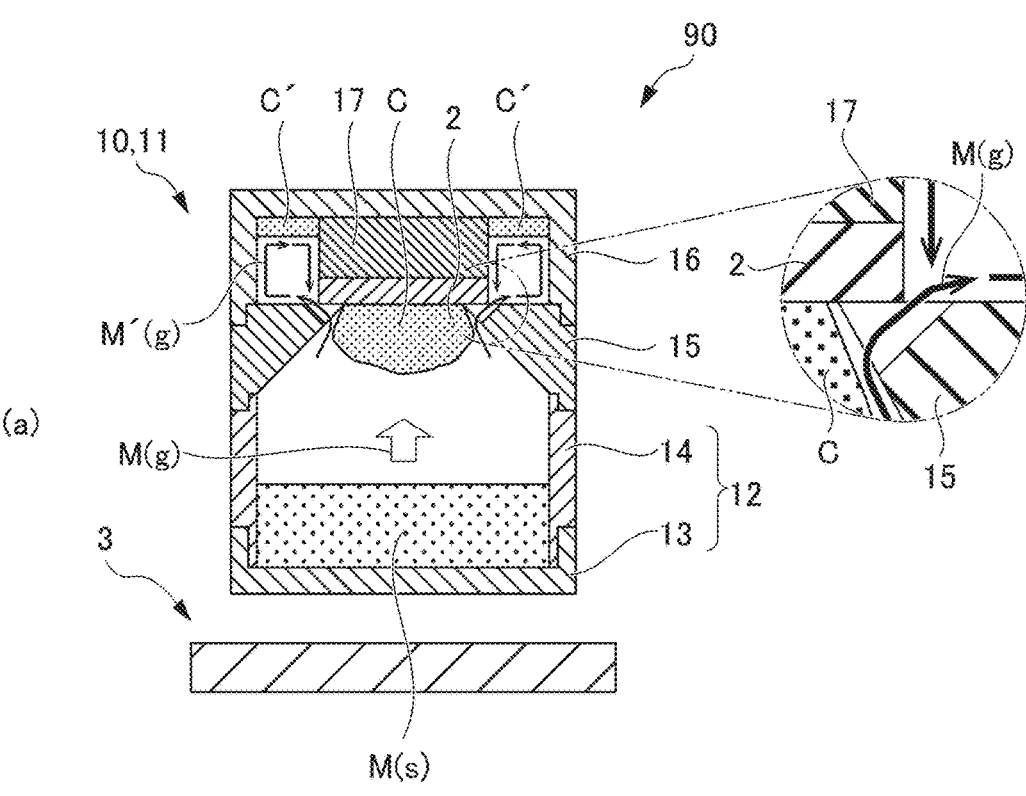
FIG. 7 shows cross-sectional views of a comparative SiC single-crystal growth apparatus, schematically illustrating the structure of its main components and a growing SiC single crystal, FIG. 7(*a*) showing the SiC single crystal as found 50 hours after initiation of growth of the SiC single crystal, FIG. 7(*b*) showing the SiC single crystal as found 100 hours after initiation of growth of the SiC single crystal.
Figure 7:
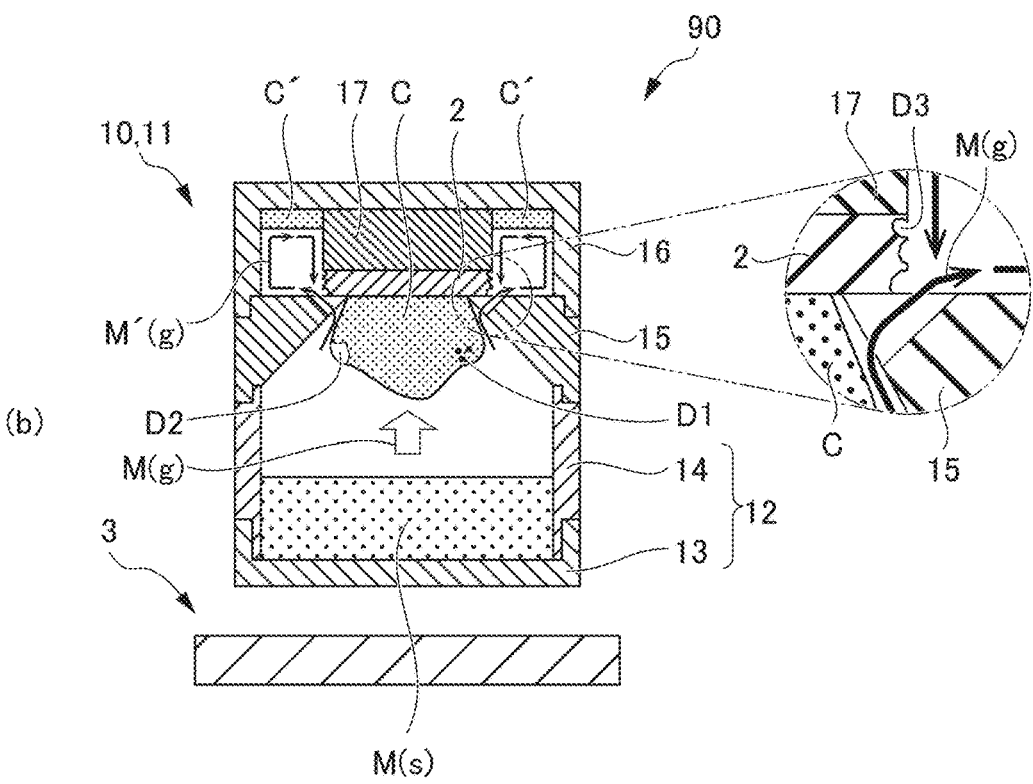

To reduce variations in the temperature distribution in the seed crystal 2, the surface area of the first anisotropic sheet 41 is preferably larger than the surface area of each of the seed crystal 2 and seat 17. It is particularly preferable that the first anisotropic sheet 41 is formed so as to expand relative to both the seed crystal 2 and seat 17. In the SiC single-crystal growth apparatus 1 of the present embodiment, when the solid source material M(s) is heated by the heating member 3 discussed further below to sublimate it into gaseous source material M(g) that is supplied to the seed crystal 2 to grow the SiC single crystal C, a gas flow is formed where gaseous source material M(g) also flows into spaces on the sides of the seed crystal 2, as shown in FIG. 2, and produces SiC polycrystal C' on the lid 16 and then returns back toward the solid source material M(s). If the first anisotropic sheet 41 expands relative to both the seed crystal 2 and seat 17, the sheet portions located outward of the crystal and the seat work as a baffle plate to trap vapor containing excessive Si contained in the gaseous source material M(g). Further, those sheet portions make it less likely that edge portions of the seed crystal 2 sublimate to adhere to the SiC polycrystal C' such that the seed crystal 2 suffers damage D3, as shown in FIG. 7. Further, those sheet portions outward of the crystal and seat, working as a baffle plate, promote production of the SiC polycrystal C' on the lid 16, thereby stabilizing the vapor pressure of Si-containing vapor in the interior space S, making it less likely that silicon droplets on the growing SiC single crystal C produce defects that cause production of polycrystal D2 on the SiC single crystal C or that Si-containing vapor damages the heating vessel 10, for example.

By comparison, in a comparative SiC single-crystal growth apparatus 90 shown in FIGS. 7(a) and 7(b), for example, during the growth of the SiC single crystal C, vapor containing excessive Si contained in the gaseous source material M(g) that has flowed into spaces on the sides of the seed crystal 2 is not effectively trapped because there is no first anisotropic sheet 41 expanding outward of the seat 17, and thus the vapor pressure of Si-containing vapor in the interior space S is destabilized, which results in silicon droplets on the SiC single crystal C, making it more likely that polycrystal D2 is produced.

Although not limiting, the Si-containing vapor may be vapor of Si, $SiC_2$, or $Si_2C$.

Figure 3:
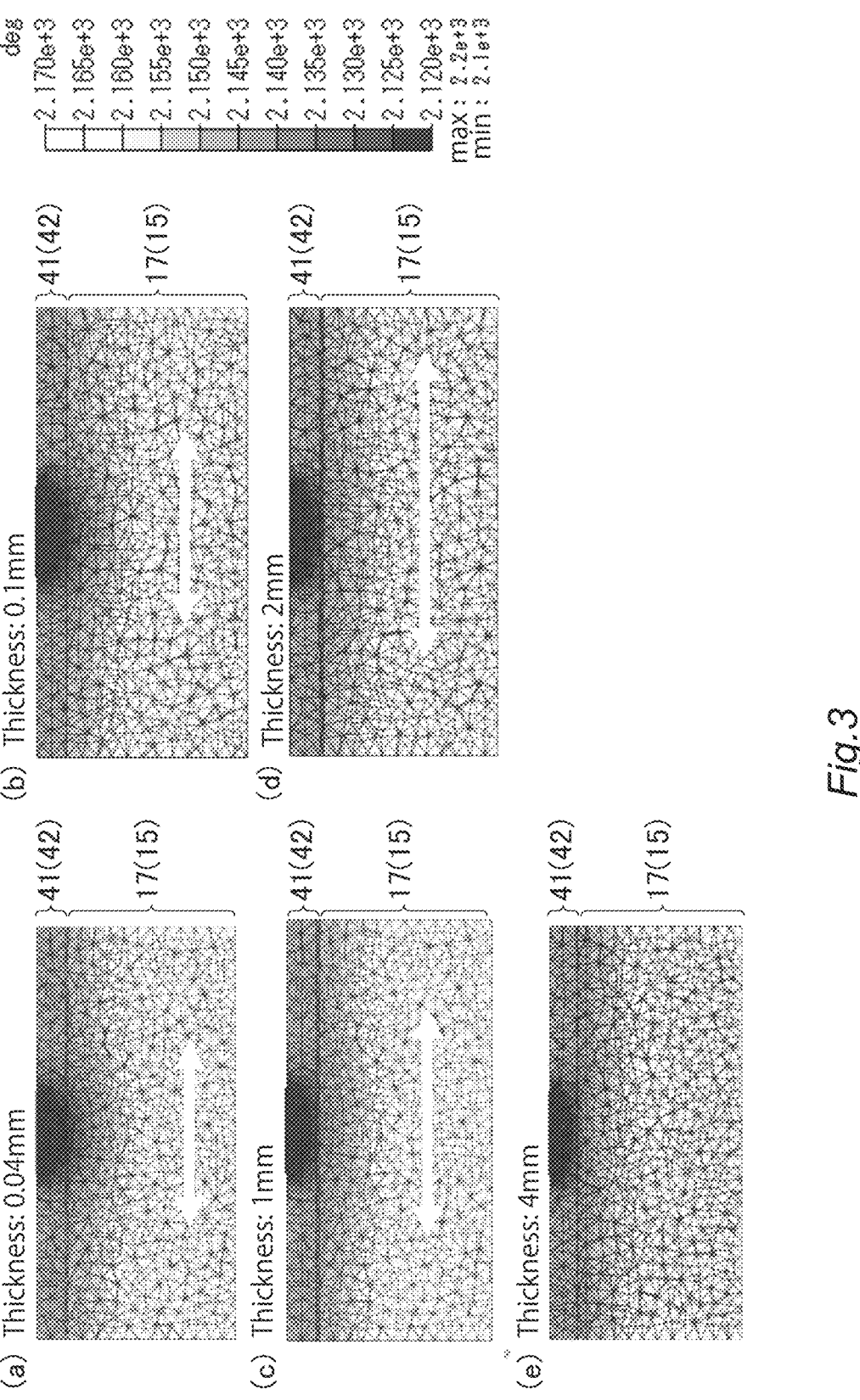
FIG. 3 illustrates results of simulations of heat transfer from the anisotropic sheet to an adjacent member, FIG. 3(*a*) showing a case where the thickness of the anisotropic sheet is 0.04 mm, FIG. 3(*b*) showing a case where the thickness of the anisotropic sheet is 0.1 mm, FIG. 3(*c*) showing a case where the thickness of the anisotropic sheet is 1 mm, FIG. 3(*d*) showing a case where the thickness of the anisotropic sheet is 2 mm, FIG. 3(*e*) showing a case where the thickness of the anisotropic sheet is 4 mm.

To allow heat generated by the growth of the SiC single crystal C to be released to the seat 17 to promote the growth of the SiC single crystal C, the thickness of the first anisotropic sheet 41 is preferably not larger than 2 mm. FIG. 3 illustrates results of simulations of heat transfer from the anisotropic sheet to an adjacent member, FIG. 3(a) showing a case where the thickness of the anisotropic sheet is 0.04 mm, FIG. 3(b) showing a case where the thickness of the anisotropic sheet is 0.1 mm, FIG. 3(c) showing a case where the thickness of the anisotropic sheet is 1 mm, FIG. 3(d) showing a case where the thickness of the anisotropic sheet is 2 mm, FIG. 3(e) showing a case where the thickness of the anisotropic sheet is 4 mm. The simulations in FIG. 3 allow prediction of whether local cooling of part of the surface of the anisotropic sheet affects temperatures in an adjacent member, and thus allows prediction of whether heat is transferred to an adjacent member. As shown in FIGS. 3(a) to 3(d), if the thickness of the anisotropic sheet is not larger than 2 mm, temperature has decreased in the portions of the adjacent member indicated by the two-way arrows, which suggests that heat is likely to be released from an anisotropic sheet, i.e., first anisotropic sheet 41 or second anisotropic sheet 42, to an adjacent member, i.e., seat 17 or guide member 15. On the other hand, if the thickness of the anisotropic sheet exceeds 2 mm, as shown in FIG. 3(e), no temperature decrease is observed in the adjacent member, suggesting that heat is unlikely to be released from the anisotropic sheet to the seat 17 or guide member 15.

On the other hand, from the viewpoint of easiness of handling the first anisotropic sheet 41 as an independent film, a lower limit for its thickness is preferably not smaller than 0.04 mm. Nevertheless, since the first anisotropic sheet 41 is laid over the seat 17 when it is used, its implementation is not limited to an independent film, and the thickness may be smaller than 0.04 mm.

The first anisotropic sheet 41 may be constituted by a single anisotropic sheet, or by a plurality of anisotropic sheets overlying one another.

Figure 4:
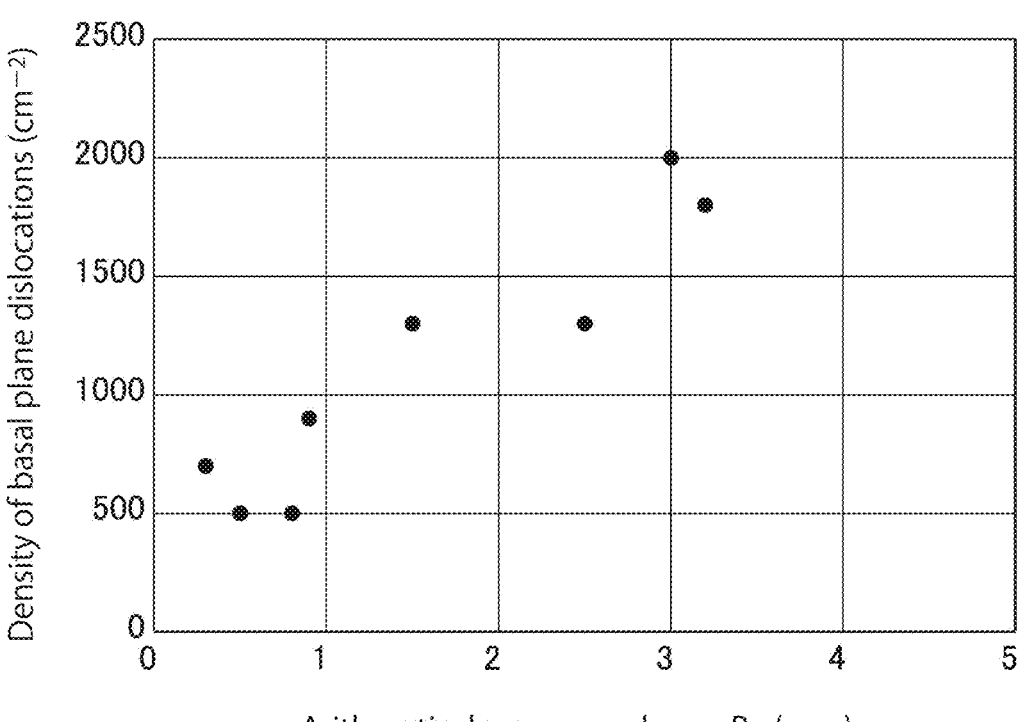
FIG. 4 is a graph showing the relationship between the arithmetical mean roughness (Ra) and the density of basal plane dislocations in the resulting SiC single crystal, where the horizontal axis indicates arithmetical mean roughness (Ra) [μm] and the vertical axis indicates the density of basal plane dislocations [cm$^{-2}$].

In the first anisotropic sheet 41, the arithmetical mean roughness (Ra) of the seed crystal-mounting surface 41a, to which the seed crystal 2 is attached, is preferably not higher than 1 μm. Those portions of the surface of the seed crystal 2 which are to contact the first anisotropic sheet 41 are preferably subjected to specular working. FIG. 4 is a graph showing the relationship between the arithmetical mean roughness (Ra) of the first anisotropic sheet and the density of basal plane dislocations in the resulting SiC single crystal, where the horizontal axis indicates arithmetical mean roughness (Ra) [μm] and the vertical axis indicates the density of basal plane dislocations [$cm^{-2}$]. The experiments were all conducted under the same conditions except for the arithmetical mean roughness (Ra) of the anisotropic sheet. From the results, a tendency is observed that the density of basal plane dislocations was smaller when the arithmetical mean roughness (Ra) of the anisotropic sheet was not higher than 1 μm than when the roughness exceeded 1 μm, as shown in FIG. 4. This means that, if the arithmetical mean roughness (Ra) of the first anisotropic sheet 41 is not higher than 1 μm, the density of basal plane dislocations in the resulting SiC single crystal C can be reduced. Further, if one or both of the first anisotropic sheet 41 and/or seed crystal 2 has/have a flat surface, the surface of the seed crystal 2 can easily slide over the seed crystal-mounting surface 41a of the first anisotropic sheet 41, which helps reduce thermal stress acting on the seed crystal 2.

The anisotropic material constituting the first anisotropic sheet 41 may be formed such that its elastic modulus in an in-plane direction x is high and the elastic modulus in the thickness direction y is low. This allows thermal stress due to the differences in thermal expansion between the seed crystal 2 and the seat 17 to be absorbed by the sheet deforming in the thickness direction y.

It is to be noted that, in an anisotropic material such as carbon felt or graphite sheet, a higher elastic modulus usually means a higher thermal conductivity.

Mounting of the SiC seed crystal 2 on the seat 17 provided with the first anisotropic sheet 41 is not limited to any particular means, and may be done by any known mechanical means.

In addition, the SiC seed crystal 2 mounted on the seat 17 may be supported, at its periphery, by a plurality of protrusions (not shown) protruding from the guide member 15 discussed further below toward the surface of the seed crystal 2, for example. Thus, the seed crystal 2 is clamped by the seat 17 and the protrusions on the guide member 15, which improves the contact between the seat 17 and seed crystal 2, thereby promoting release of heat generated by the growth of the SiC single crystal C toward the seat 17 through the first anisotropic sheet 41, discussed further below. Furthermore, since one of the surfaces of the seed crystal 2 faces the solid source material M(s), variations in the growth rate of the SiC single crystal C along an in-plane direction x are reduced.

The SiC seed crystal 2 is not limited to any particular size. In the SiC single-crystal growth apparatus of the present embodiment, even if the area of the growth surface of the seed crystal 2 is large, variations in the temperature distribution in the seat 17 are reduced by the first anisotropic sheet 41, which makes it less likely that thermal stress in or distortion of the seed crystal 2 occurs, enabling the growth of a large-area SiC single crystal C with reduced defects and cracks.

It is desirable that the crucible 11 be formed from a material that can resist high temperatures because it experiences high temperatures when the solid source material M(s) is sublimated to grow the SiC single crystal C. Examples of such high-temperature-resistant materials include graphite, tantalum-coated graphite, and tantalum carbide.

(Heating Member)

The heating member 3 heats solid source material M(s). More specifically, the heating member 3 heats solid source material M(s) contained in the heating vessel 10 to sublimate the solid source material M(s). Gaseous source material M(g) generated through sublimation passes through the interior space S defined by the cylindrical peripheral side portion 14 of the crucible 11 to reach the seed crystal 2 and is cooled by the seed crystal 2, thereby growing the SiC single crystal C.

The heating member 3 is constructed to heat solid source material M(s) contained in the source material-containing portion 12 of the heating vessel 10. As shown in FIG. 1, the heating member 3 may be positioned in such a positional relationship as to cover the outer surface of the bottom portion 13 of the heating vessel 10. Further, the heating member 3 may also be positioned in such a positional relationship as to cover the outer surface of the peripheral side portion 14 of the heating vessel 10 (not shown).

The heat source constituting the heating member 3 is not limited to any particular type, and may use any known means such as resistance heating or induction heating.

(Method of Growing SiC Crystal)

A method of growing an SiC crystal of the present embodiment includes growing an SiC single crystal C using the above-described SiC single-crystal growth apparatus. More specifically, the SiC single-crystal growth apparatus 1 heats solid source material M(s) using the heating member 3, discussed further below, to sublimate it into gaseous source material M(g), and supplies this gaseous source material M(g) to the seed crystal 2 to grow the SiC single crystal C. The growth of the SiC single crystal C is not limited to any particular growth conditions except for the SiC single-crystal growth apparatus 1, and any known SiC crystal growth conditions may be used.

Second Embodiment

Figure 5:
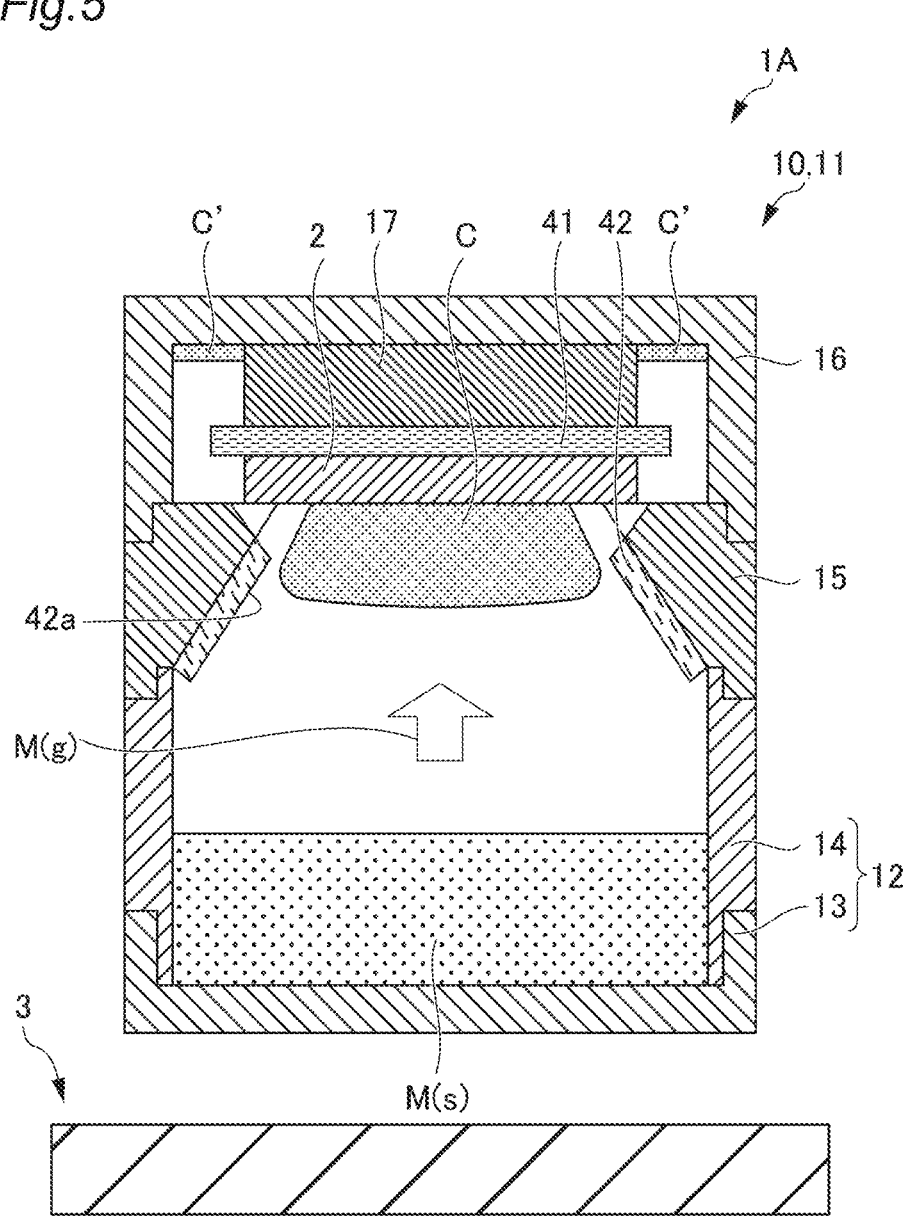
FIG. 5 is a cross-sectional view of an SiC single-crystal growth apparatus of a second embodiment the present invention, schematically illustrating the structure of its main components.

FIG. 5 is a cross-sectional view of an SiC single-crystal growth apparatus of a second embodiment the present invention, schematically illustrating the structure of its main components. In the following description, the same elements as for the first embodiment above are labeled with the same reference numerals and their description will be omitted or simplified, and mainly the differences will be described.

The first embodiment above, as shown in FIGS. 1(a) and 1(b), illustrates an arrangement where a first anisotropic sheet 41 having anisotropy in thermal conductivity is provided between the seat 17 and seed crystal 2; however, the present invention is not limited to such an arrangement. In addition to the above-described first anisotropic sheet 41, another sheet made of an anisotropic material may be provided.

For example, the SiC single-crystal growth apparatus 1A shown in FIG. 5 includes a guide member 15 located in the interior space S and between the seed crystal 2 and the source material-containing portion 12 and at a peripheral side portion of the heating vessel 10 for guiding the direction of growth of the SiC single crystal C growing from a surface of the seed crystal 2, the guide member being located adjacent to the peripheral side surface of the SiC single crystal C.

In the SiC single-crystal growth apparatus 1A, including the guide member 15 adjacent to the peripheral side surface of the SiC single crystal C, the surface of the guide member 15 is heated by heat generated by the growth of the SiC single crystal C, for example, which makes it less likely that the SiC single crystal C grows near the surface of the guide member 15, that SiC precipitates on the surface of the guide member 15, and that the guide member 15 and SiC single crystal C contact each other. Thus, the direction of growth of the SiC single crystal C can be guided along the guide member 15, and it is also less likely that precipitated SiC enters the SiC single crystal C and thus decreases the effective diameter of the SiC single crystal C or that the SiC single crystal C contacts the guide member 15 and produces defects or cracks.

It is particularly preferable that, in the SiC single-crystal growth apparatus 1A of FIG. 5, the surface of the guide member 15 that faces the growing SiC single crystal C is covered with a second anisotropic sheet 42 having anisotropy in thermal conductivity. Thus, the guide member 15 is protected by the second anisotropic sheet 42, making it less likely that Si-containing vapor damages the guide member 15 and that such damage causes contamination (i.e., inclusion) D1 in the SiC single crystal C.

As is the case with the first anisotropic sheet 41, the second anisotropic sheet 42 is formed such that the thermal conductivity in an in-plane direction is high and the thermal conductivity in the thickness direction is low. That is, the thermal conductivity in an in-plane direction is higher than the thermal conductivity in the thickness direction. This reduces variations in the temperature distribution in the sheet plane of the second anisotropic sheet 42; as such, particularly when the crystal growth is in an early stage and only a narrow area of the guide member 15 located in the vicinity of the seed crystal 2 is heated, temperature can be increased in larger areas of the guide member 15, thereby making it even less likely that SiC precipitates on the surface of the guide member 15. Further, heating the guide member 15 causes portions of the SiC single crystal C that are less distant from the guide member 15 to sublimate, which makes it yet less likely that the SiC single crystal C contacts the guide member 15 and produces defects or cracks.

As is the case with the first anisotropic sheet 41, the anisotropic material used to form the second anisotropic sheet 42 is preferably a carbon material containing carbon fiber. Such an anisotropic material may be formed by, for example, positioning a thin piece of carbon felt or graphite sheet along a plane that is to provide an in-plane direction. Particularly, in the SiC single-crystal growth apparatus 1A, implementing the second anisotropic sheet 42 as a thin piece of carbon felt or graphite sheet enables the second anisotropic sheet 42 to be bent, which allows the second anisotropic sheet 42 to be laid over the guide member 15.

In the anisotropic material constituting the second anisotropic sheet 42, the ratio of the thermal conductivity in an in-plane direction to the thermal conductivity in the thickness direction is preferably not lower than 2, and more preferably not lower than 10. An upper limit for the ratio of the thermal conductivity in an in-plane direction to the thermal conductivity in the thickness direction may be 1000. To reduce variations in the temperature distribution in the surface of the guide member 15, the surface area of the second anisotropic sheet 42 is preferably larger than the surface area of the guide member 15 and, particularly, covers the entire surface of the guide member 15.

In the second anisotropic sheet 42, the arithmetical mean roughness (Ra) of the single crystal-facing surface 42a, which faces the growing SiC single crystal C, is preferably not higher than 1 μm. Thus, for the same reasons that are given above in connection with the first anisotropic sheet 41 with respect to FIG. 4, the density of basal plane dislocations in the resulting SiC single crystal C can be reduced. Further, as production of crystal nuclei is prevented in the single crystal-facing surface 42a of the second anisotropic sheet 42, SiC is less likely to precipitate on the surface of the second anisotropic sheet 42. Further, as production of crystal nuclei is prevented at and near the resulting SiC single crystal C, nuclei for polycrystal D2 are less likely to grow in the SiC single crystal C. Furthermore, even if the grown SiC single crystal C contacts the single crystal-facing surface 42a, the surface of the SiC single crystal C can easily slide over the single crystal-facing surface 42a of the second anisotropic sheet 42, which reduces thermal stress acting on the SiC single crystal C, making it less likely that the defects or cracks are produced in the SiC single crystal C.

As shown in FIGS. 3(*a*) to 3(*d*) referred to above, the thickness of the second anisotropic sheet 42 is preferably not larger than 2 mm to promote heat release to the guide member 15 through the second anisotropic sheet 42. On the other hand, to increase mechanical strengths of the second anisotropic sheet 42 and increase the uniformity of temperature along an in-plane direction of the second anisotropic sheet 42, a lower limit for the thickness of the second anisotropic sheet 42 is preferably not smaller than 0.04 mm. If the second anisotropic sheet 42 is laid over the guide member 15 when it is used, its implementation is not limited to an independent film, and the thickness may be smaller than 0.04 mm.

The second anisotropic sheet 42 may be constituted by a single anisotropic sheet, or by a plurality of anisotropic sheets overlying one another.

Third Embodiment

Figure 6:
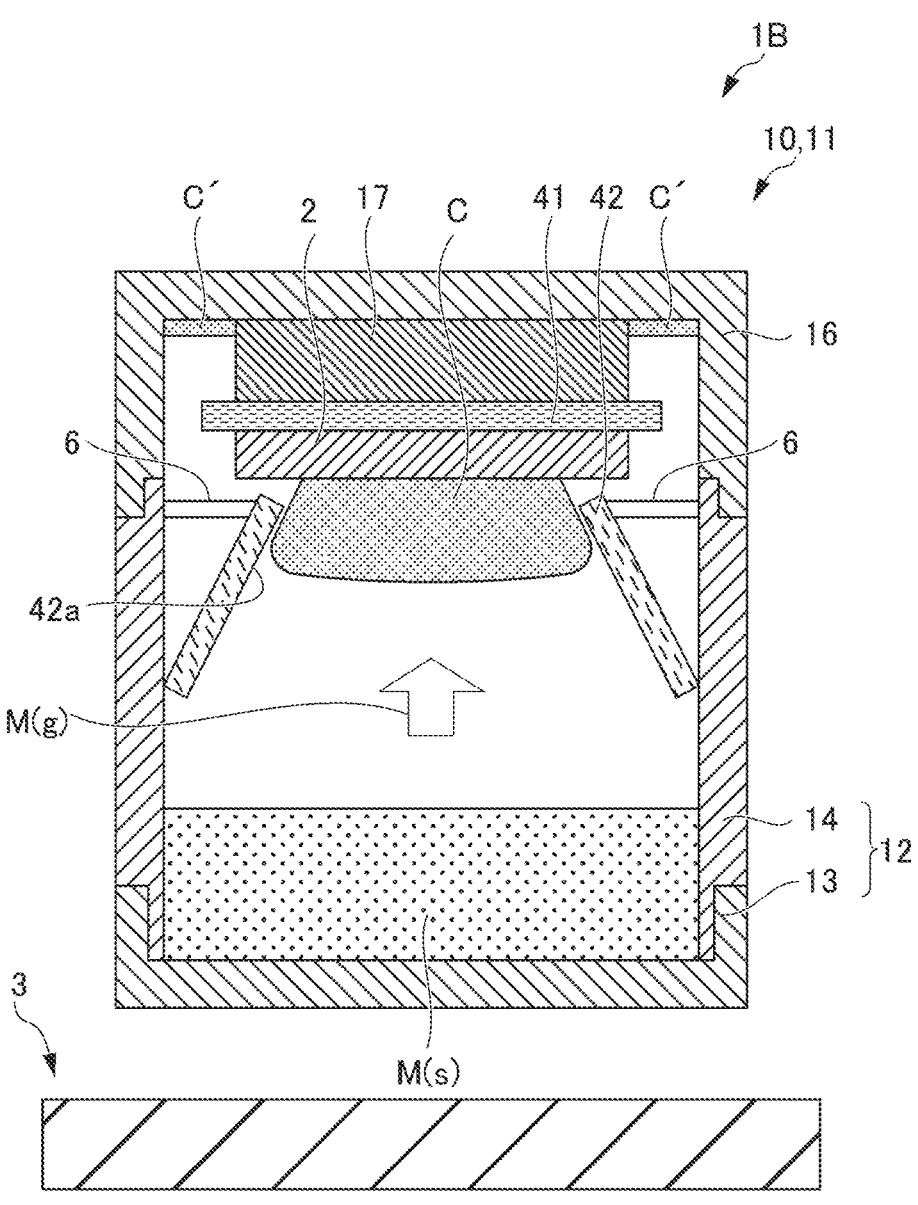
FIG. 6 is a cross-sectional view of an SiC single-crystal growth apparatus of a third embodiment the present invention, schematically illustrating the structure of its main components.

FIG. 6 is a cross-sectional view of an SiC single-crystal growth apparatus of a third embodiment the present invention, schematically illustrating the structure of its main components. In the following description, the same elements as for the first or second embodiment above are labeled with the same reference numerals and their description will be omitted or simplified, and mainly the differences will be described.

The second embodiment above, as shown in FIG. 5, illustrates an arrangement where the SiC single-crystal growth apparatus 1A includes a guide member 15 and the surface of the guide member 15 is provided with a second anisotropic sheet 42; however, the present invention is not limited to such an arrangement. For example, as in an SiC single-crystal growth apparatus 1B shown in FIG. 6, a second anisotropic sheet 42 alone may be provided without a guide member 15. In such implementations, at least portions of the second anisotropic sheet 42 are preferably supported by support members 5.

To allow the second anisotropic sheet 42 to be used in an independent state, the thickness of the second anisotropic sheet 42 of the SiC single-crystal growth apparatus 1B is preferably not smaller than 0.1 mm. On the other hand, to promote heat release to the guide member 15 through the second anisotropic sheet 42, the thickness of the second anisotropic sheet 42 is preferably not larger than 2 mm.

Although embodiments of the present invention have been described, the present invention is not limited to the above-described embodiments but encompasses any implementations encompassed by the concept of the present invention and the scope of the claims, and may be modified in various manners within the scope of the present invention.

EXAMPLES

Next, examples of the present invention will be described to further clarify the effects of the present invention, although the present invention is not limited to these examples.

Inventive Example 1

In an arrangement as shown in FIG. 1, a crucible 11 was prepared that had a source material-containing portion 12 with an columnar interior space S with an inner diameter of 180 mm and a height of 160 mm, the interior space S defined by a cylindrical peripheral side portion 14; solid source material M(s), i.e., SiC powder, was placed in the crucible to a height of 60 mm from the bottom of the interior space S; further, a tubular guide member 15 was provided in an upper portion of the interior space S of the source material-containing portion 12 and at a peripheral side portion of the crucible 11 and having the shape of a truncated cone with a diameter of 180 mm toward the bottom (i.e., toward the source material-containing portion 12), a diameter of 149 mm toward the top (i.e., toward the seed crystal 2) and a height of 30 mm; adjacent to this guide member 15 and upward thereof was positioned a seed crystal on a lid 16 of the crucible 11, having a diameter of 150 mm and a thickness of 2 mm and fixed on a seat 17 with a diameter of 150 mm and a thickness of 20 mm, with a first anisotropic sheet 41 positioned between the guide member and the seat. The apparatus was constructed such that the growth surface of the seed crystal 2 was positioned at a height of 128 mm from the bottom of the interior space S.

The first anisotropic sheet 41 was made of an anisotropic material, i.e., graphite sheet, having a diameter of 155 mm and a thickness of 0.04 mm and formed to concentrically expand relative to both the seat 17 and seed crystal 2. In this anisotropic material, the thermal conductivity in an in-plane direction x was 400 W/mK (at 2200° C.) and the thermal conductivity in the thickness direction y was 1.5 W/mK (at 2200° C.). As such, the ratio of the thermal conductivity in the thickness direction y to the thermal conductivity in an in-plane direction x was 266. On the other hand, the seat 17 was made of an isotropic graphite, with a thermal conductivity of 40 W/mK (at 2200° C.).

The heating vessel 10 constituted by this crucible 11 was placed on a heating member 3 having the shape of a flat plate with a diameter of 250 mm, provided with a heat source constituted by a resistance heating member. Then, the solid source material M(s) was heated where the temperature of the heating vessel 10 was in the range of 2300° C.±10° C. to grow the SiC single crystal C for 50 hours.

The result shows that the density of basal plane dislocations in the resulting SiC single crystal C was 1000 cm$^{-2}$.

Inventive Example 2

In an arrangement as shown in FIG. 5, a second anisotropic sheet 42 was provided over the entire surface of the guide member 15 that faces the growing SiC single crystal C.

In the present example, the second anisotropic sheet 42 was obtained by laying anisotropic material graphite sheets over one another to a total thickness of 0.1 mm. In this anisotropic material, the thermal conductivity in an in-plane direction x was 300 W/mK (at 2200° C.) and the thermal conductivity in the thickness direction y was 1 W/mK (at 2200° C.).

Otherwise, under the same conditions as for Inventive Example 1, the SiC single crystal C was grown for 100 hours.

The result shows that the density of basal plane dislocations in the resulting SiC single crystal C was 1500 cm$^{-2}$.

Inventive Example 3

In an arrangement as shown in FIG. 6, an independent second anisotropic sheet 42 was provided having a thickness of 1 mm, without a guide member 15, and fixed to the heating vessel 10 using support members 5.

Otherwise, under the same conditions as for Inventive Example 2, the SiC single crystal C was grown for 100 hours.

The result shows that the density of basal plane dislocations in the resulting SiC single crystal C was 1000 cm$^{-2}$.

Comparative Example 1

In an arrangement as shown in FIGS. 7(*a*) and 7(*b*), a comparative SiC single-crystal growth apparatus 90 was constructed having neither a first anisotropic sheet 41 nor a second anisotropic sheet 42. Under the same conditions as for Inventive Example 2 except for the first and second anisotropic sheets 41 and 42, the SiC single crystal C was grown for 100 hours.

The result shows that the density of basal plane dislocations after 50 hours of crystal growth in the resulting SiC single crystal C was 10000 cm$^{-2}$. Further, the density of basal plane dislocations after 100 hours of crystal growth in the resulting SiC single crystal C was 20000 cm$^{-2}$.

The above shows that, in each of the SiC single-crystal growth apparatus of Inventive Examples 1 to 3 including a first anisotropic sheet 41 with anisotropy in thermal conductivity, the density of basal plane dislocations after 50 to 100 hours of crystal growth was not higher than 2000 cm$^{-2}$.

Thus, the SiC single-crystal growth apparatus of Inventive Examples 1 to 3 were able to reduce variations in the temperature distribution in the seed crystal 2 as well as to reduce deformation of, and/or damage to, the seed crystal 2, thereby growing an SiC single crystal with reduced defects or cracks.

Particularly, with the SiC single-crystal growth apparatus of Inventive Example 3, the density of basal plane dislocations in the resulting SiC single crystal C was lower than with the SiC single-crystal growth apparatus of Inventive Example 2 including a guide member 15. This is presumably because the absence of restraint of the second anisotropic sheet 42 by the guide member 15 reduced the thermal stress in the second anisotropic sheet 42 and thus its effects.

On the other hand, the comparative SiC single-crystal growth apparatus 90 of Comparative Example 1 did not have a first anisotropic sheet 41, resulting in a high density of basal plane dislocations in the resulting SiC single crystal C. Further, the SiC single crystal after 100 hours of crystal growth had polycrystal D2, which had been first formed on the surface of the guide member 15 and then entered the crystal, leading to a smaller effective diameter. Furthermore, part of the heating vessel 10 was eroded, and the SiC single crystal C suffered contamination (i.e., inclusion) D1.

The polycrystal D2 was produced in the SiC single crystal C of Comparative Example 1 particularly because vapor containing excessive Si was not trapped and thus produced silicon droplets, which formed the polycrystal. Further, the absence of a first anisotropic sheet 41 increased variations in the temperature distribution in the seed crystal 2, which increased the density of basal plane dislocations.

The contamination (i.e., inclusion) D1 occurred in the SiC single crystal C of Comparative Example 1 presumably because part of the heating vessel 10 was eroded and this erosion produced fine powder derived from the heating vessel 10, which contaminated the SiC single crystal C.

REFERENCE SIGNS LIST

1, 1A, 1B SiC single-crystal growth apparatus
10 heating vessel
11 crucible
12 source material-containing portion
13 bottom portion of source material-containing portion
14 peripheral side portion of source material-containing portion
15 guide member
16 lid
17 seat
2 (SiC) seed crystal
3 heating member
41 first anisotropic sheet
42 second anisotropic sheet
42*a* single crystal-facing surface of second anisotropic sheet
5 support members
90 comparative SiC single-crystal growth apparatus
S interior space
x in-plane direction of first anisotropic sheet
y thickness direction of first anisotropic sheet
M(s) solid source material
M(g) gaseous source material
D1 contamination (inclusion) in SiC single crystal
D2 polycrystal having entered SiC single crystal
D3 damage to edge of seed crystal

The invention claimed is:

1. A silicon carbide (SiC) single-crystal growth apparatus comprising:
a heating vessel including a source material-containing portion adapted to contain a solid source material of SiC in one of an upper portion or a lower portion of an interior space defined by a cylindrical peripheral side portion, and including a seat located in another portion located opposite to said one portion for allowing a seed crystal of SiC to be mounted thereon; and
a heating member adapted to heat the solid source material, wherein:

the seed crystal is mounted on the seat with a first anisotropic sheet positioned therebetween, the first anisotropic sheet having anisotropy in thermal conductivity;

in the first anisotropic sheet, a thermal conductivity in a direction in a plane of the sheet is high and a thermal conductivity in a thickness direction of the sheet is low; and the first anisotropic sheet is formed to have a larger surface area than each of the seed crystal and the seat so as to expand from between the seed crystal and the seat.

2. The SiC single-crystal growth apparatus according to claim 1, wherein a seed crystal-mounting surface of the first anisotropic sheet has an arithmetical mean roughness (Ra) not higher than 1 μm.

3. The SiC single-crystal growth apparatus according to claim 1, wherein the first anisotropic sheet has a thickness in a range of not smaller than 0.04 mm and not larger than 2 mm.

4. The SiC single-crystal growth apparatus according to claim 1, further comprising:

a guide member located in the interior space and between the seed crystal and the source material-containing portion and at a peripheral side portion of the heating vessel for guiding a direction of growth of the SiC single crystal growing from a surface of the seed crystal, the guide member being located adjacent to a peripheral side surface of the SiC single crystal, wherein:

a surface of the guide member facing the growing SiC single crystal is covered with a second anisotropic sheet having anisotropy in thermal conductivity; and, in the second anisotropic sheet, a thermal conductivity in a direction in a plane of the sheet is high and a thermal conductivity in a thickness direction of the sheet is low.

5. The SiC single-crystal growth apparatus according to claim 4, wherein the surface of the second anisotropic sheet facing the single crystal has an arithmetical mean roughness (Ra) not higher than 1 μm.

6. The SiC single-crystal growth apparatus according to claim 4, wherein the second anisotropic sheet has a thickness in a range of not smaller than 0.04 mm and not larger than 2 mm.

7. A method of growing a silicon carbide (SiC) crystal, comprising growing an SiC single crystal using the SiC single-crystal growth apparatus according to claim 1.

* * * * *